(12) United States Patent
Chen et al.

(10) Patent No.: US 8,537,630 B2
(45) Date of Patent: *Sep. 17, 2013

(54) MEMORY PROGRAM DISCHARGE CIRCUIT OF BIT LINES WITH MULTIPLE DISCHARGE PATHS

(71) Applicants: Chung-Kuang Chen, Pan Chiao (TW); Han-Sung Chen, Hsinchu (TW); Chun-Hsiung Hung, Hsinchu (TW)

(72) Inventors: Chung-Kuang Chen, Pan Chiao (TW); Han-Sung Chen, Hsinchu (TW); Chun-Hsiung Hung, Hsinchu (TW)

(73) Assignee: Macronix International Co., Ltd., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 13/722,530

(22) Filed: Dec. 20, 2012

(65) Prior Publication Data

US 2013/0107637 A1    May 2, 2013

Related U.S. Application Data

(63) Continuation of application No. 12/769,502, filed on Apr. 28, 2010, now Pat. No. 8,358,550.

(30) Foreign Application Priority Data

Jan. 20, 2010   (TW) .............................. 99101551 A

(51) Int. Cl.
*G11C 7/00* (2006.01)

(52) U.S. Cl.
USPC ................ 365/203; 365/185.25; 365/189.12; 365/189.05

(58) Field of Classification Search
USPC ................... 365/203, 189.25, 189.12, 189.05
See application file for complete search history.

(56) References Cited

U.S. PATENT DOCUMENTS

| | | | |
|---|---|---|---|
| 5,754,475 A | 5/1998 | Bill et al. | |
| 6,011,725 A | 1/2000 | Eitan | |
| 6,188,605 B1 | 2/2001 | Nomura et al. | |
| 6,529,412 B1 | 3/2003 | Chen et al. | |
| 6,940,758 B2 | 9/2005 | Chung | |
| 6,975,535 B2 | 12/2005 | Kim et al. | |
| 7,200,044 B2 * | 4/2007 | Won et al. | 365/185.22 |
| 8,179,727 B2 * | 5/2012 | Kim | 365/185.24 |
| 2005/0088878 A1 | 4/2005 | Eshel | |
| 2006/0083078 A1 | 4/2006 | Sforzin et al. | |
| 2007/0014163 A1 * | 1/2007 | Kim | 365/189.12 |
| 2009/0185432 A1 | 7/2009 | Kang | |
| 2009/0290431 A1 | 11/2009 | Park et al. | |

FOREIGN PATENT DOCUMENTS

TW    228256 B    2/2005

* cited by examiner

*Primary Examiner* — Connie Yoha
(74) *Attorney, Agent, or Firm* — Kenta Suzue; Haynes Beffel & Wolfeld LLP

(57) ABSTRACT

A memory integrated circuit has an array of nonvolatile memory cells, bit lines accessing the array of nonvolatile memory cells, and bit line discharge circuitry. The bit lines have multiple discharge paths for a bit line at a same time, during a program operation.

19 Claims, 5 Drawing Sheets

MEMORY PROGRAM DISCHARGE CIRCUIT OF BIT LINES WITH MULTIPLE DISCHARGE PATHS

RELATED APPLICATIONS

This application is a continuation of U.S. application Ser. No. 12/769,502, filed on 28 Apr. 2010 and is incorporated herein by reference.

BACKGROUND

1. Field of the Invention

This technology relates to programming of a nonvolatile memory array.

2. Description of Related Art

The threshold voltage of a nonvolatile memory cell is determined generally by the variable amount of charge which is stored in the charge storage layer of each nonvolatile memory cell. The sensing window of a memory must be sufficiently wide to allow for margin between the different threshold voltage states—such as fully programmed, fully erased, and (for multi-level cells) various intermediate states—so that a read operation can reliably distinguish between the differently programmed and erased threshold voltage states. However, different memory cells in a memory array will have varying electrical characteristics, such as resistance and capacitance, depending on the position of the memory cell in the memory array, and depending on the fabrication parameters at particular positions in the memory array. Despite such variations between individual memory cells, the sensing window must nevertheless be sufficiently wide to distinguish between the different threshold voltage states, regardless of the particular physical position of the memory cell in the array.

The "second bit effect" is yet another source of variation among the memory cells of an array which reduces the sensing window. The "second bit effect" refers to the disturbance in SONOS cells storing data on two ends of the channel, of a left end bit by a program operation on the right end bit. U.S. Pat. No. 6,011,725 (Eitan), the entire content of which is incorporated by reference herein, provides a detailed comparison of several of the prior art nonvolatile memories including respective programming, erasing and reading techniques, and the related second bit effect. The Eitan patent also discloses a type of silicon-oxide-nitride-oxide-silicon (SONOS) memory cell capable of storing two data bits by localized charge storage techniques.

Stated differently, the "second bit effect" refers to the reverse read current of an unprogrammed bit on one side of the memory, where the reverse read current must "punch through" the channel region under a programmed bit on the other side of the memory. The second bit effect narrows the operation sensing window, of the difference between the threshold voltages of a programmed bit on one side of the memory and an unprogrammed bit on the other side of the memory. Because the different memory cells of an array have different amounts of programming, the "second bit effect" also has different effects among different memory cells.

Consequently, the sensing window is defined by various considerations, such as variable stored charge, margin, and the effects described above.

SUMMARY

One aspect is an apparatus with a memory integrated circuit. The memory integrated circuit has an array of nonvolatile memory cells, bit lines accessing the array of nonvolatile memory cells, and bit line discharge circuitry.

The bit lines have a first end on a first side of the array of nonvolatile memory cells, and the bit lines have a second end on a second side of the array of nonvolatile memory cells. The bit line discharge circuitry is electrically connected to the first end and the second end of the plurality of bit lines. The bit line discharge circuitry provides multiple discharge paths to the bit lines. One embodiment includes control circuitry that is electrically connected to the bit line discharge circuitry to open the multiple discharge paths for a bit line at a same time. In one embodiment, the control circuitry opens the multiple discharge paths for the bit line at the same time during a program operation.

In one embodiment, the multiple discharge paths include a first discharge path and a second discharge path.

Some embodiments include sense amplifier multiplexer circuitry. The sense amplifier multiplexer circuitry includes multiplexer transistors having first current carrying terminals electrically connected to the second end of the bit lines, and second current carrying terminals. The sense amplifier multiplexer circuitry includes a set of output transistors electrically connected to the second current carrying terminals of the multiplexer transistors.

Different embodiments combine variations of the discharge paths.

The first discharge path is through discharge transistors of the bit line discharge circuitry electrically connected to the first end of the bit lines, such that different bit lines have the first discharge path through different discharge transistors of the discharge transistors, and In various embodiments, the second discharge path is:
through at least part of sense amplifier multiplexer circuitry electrically connected to the second end of the bit lines,
through a second group of discharge transistors electrically connected to the second end of the bit lines, such that different bit lines have the second discharge path through different ones of the second group of discharge transistors. In different cases, this second discharge path is through sense amplifier multiplexer circuitry (e.g., through the multiplexer transistors and the set of output transistors of the sense amplifier multiplexer circuitry.) In different cases, this second discharge path bypasses sense amplifier multiplexer circuitry (e.g., bypassing the multiplexer transistors and the set of output transistors of the sense amplifier multiplexer circuitry, or bypassing just the set of output transistors of the sense amplifier multiplexer circuitry.)

Another aspect of the technology is a method, comprising: Multiple discharge paths are opened at a same time by turning on multiple discharge transistors. A bit line is electrically discharged via multiple discharge paths at a same time, wherein the bit line is one of a plurality of bit lines accessing an array of nonvolatile memory cells.

Another aspect of the technology is a method of manufacturing a memory integrated circuit. An array of nonvolatile memory cells of the memory integrated circuit having a first side and a second side is provided. A plurality of bit lines of the memory integrated circuit accessing the array of nonvolatile memory cells is provided. The plurality of bit lines has a first end on the first side of the array of nonvolatile memory cells, and a second end on the second side of the array of nonvolatile memory cells. Bit line discharge circuitry of the memory integrated circuit electrically connected to the first end and the second of the plurality of bit lines is provided. The bit line discharge circuitry provides multiple discharge paths to bit lines of the plurality of bit lines. In one embodiment, control circuitry of the memory integrated circuit is provided that is electrically connected to the bit line discharge circuitry to open the multiple discharge paths for a bit line of the plurality of bit lines at a same time.

DETAILED DESCRIPTION

Figure 1:
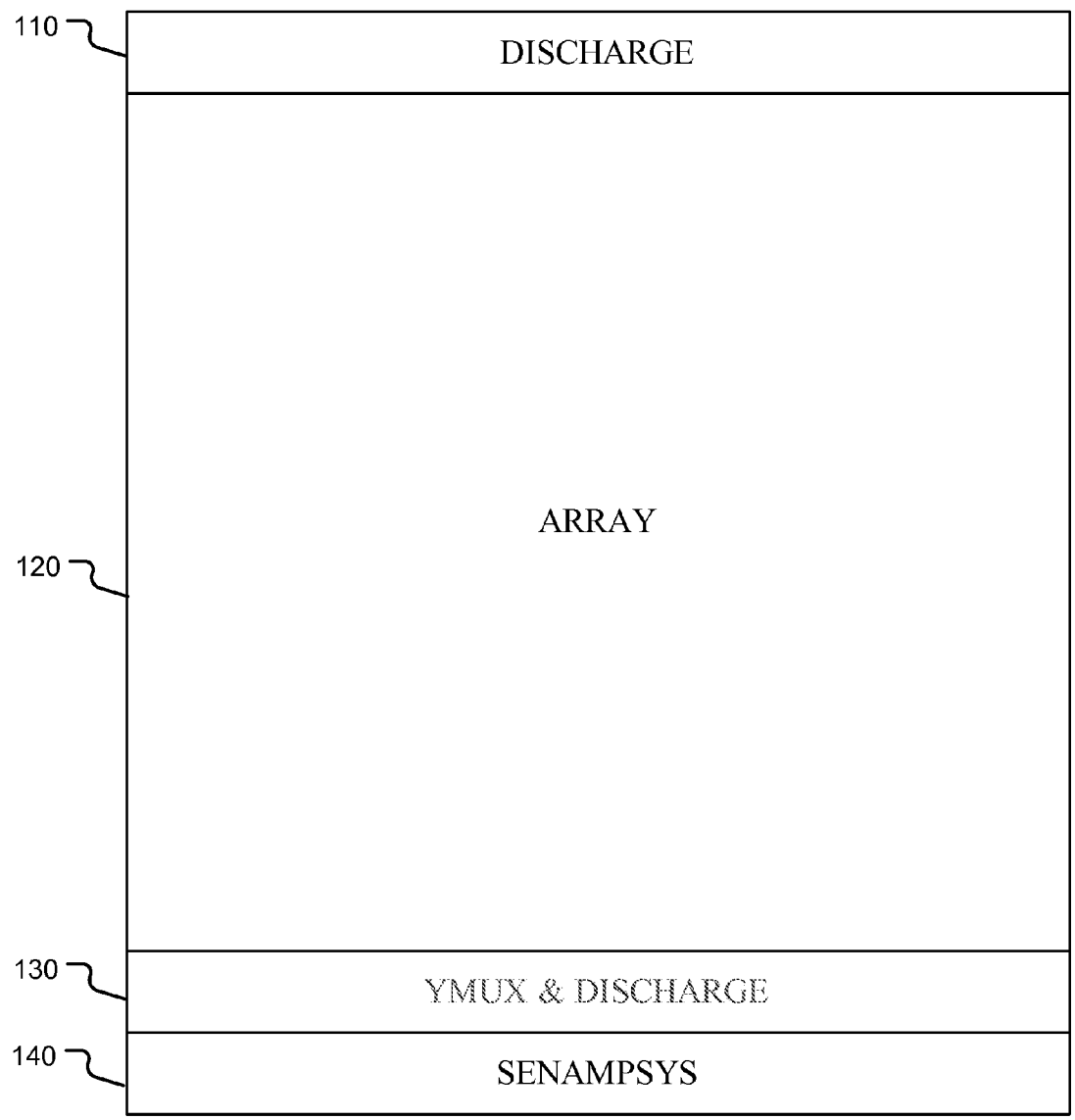
FIG. 1 is a block diagram of an improved nonvolatile memory array with multiple discharge paths for bit lines.

FIG. 1 is a block diagram of an improved nonvolatile memory array with multiple discharge paths for bit lines.

Bit lines of the nonvolatile memory array 120 have a discharge path 110 through a side of the array. In addition, the bit lines of the nonvolatile memory array 120 have a second discharge path 130 in the vicinity of the multiplexer circuitry 130 associated with the sense amplifier 140.

The embodiments of FIGS. 2 and 3 described below, decrease the integrated circuit size, by making additional use of the circuitry for the sense amplifier multiplexer, for the second bit line discharge path.

Figure 2:
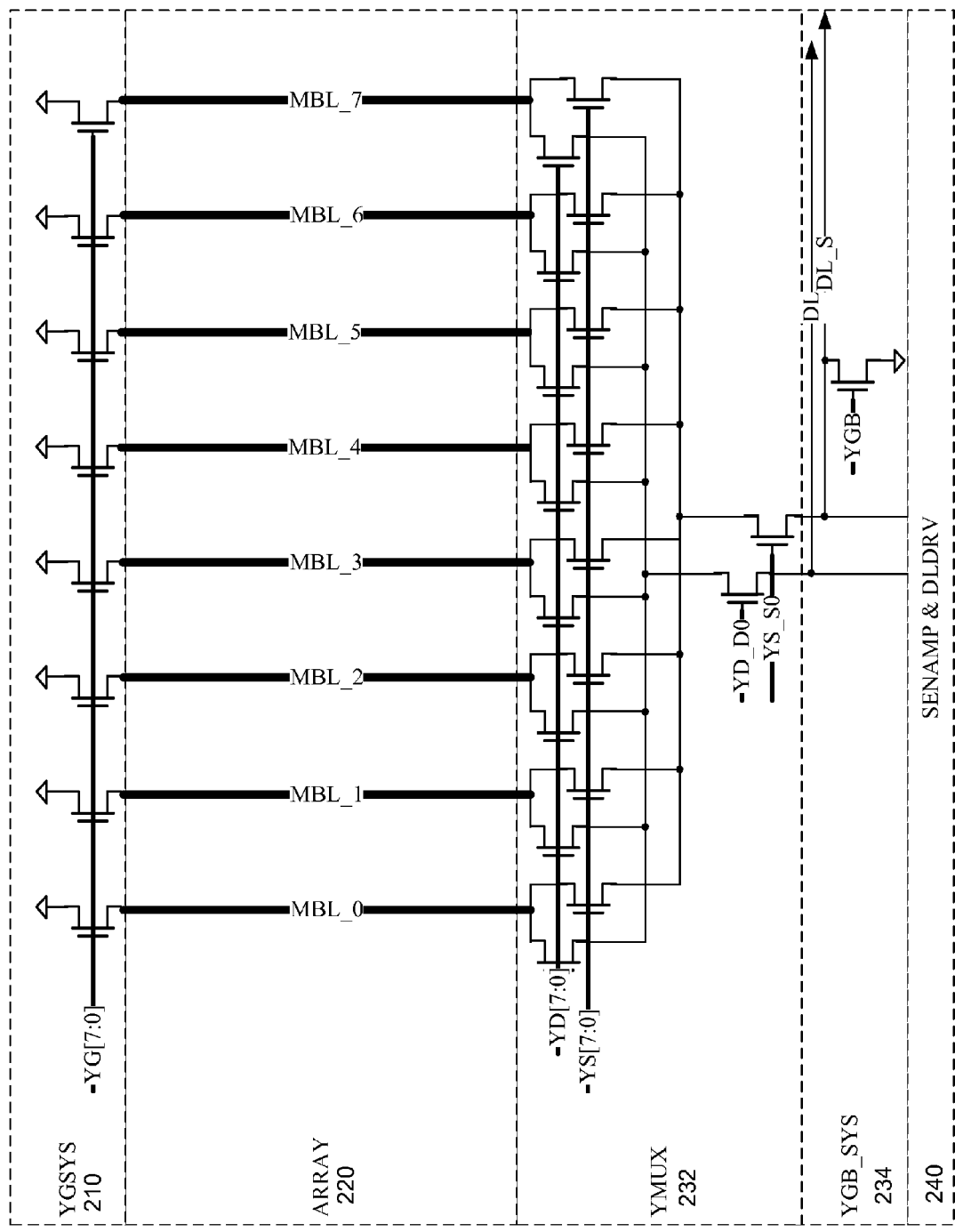
FIG. 2 is a simplified circuit diagram of an improved nonvolatile memory array with multiple discharge paths for bit lines, which electrically connects a second discharge path to an output transistor of sense amplifier multiplexer circuitry.

FIG. 2 is a simplified circuit diagram of an improved nonvolatile memory array with multiple discharge paths for bit lines, which electrically connects a second discharge path to an output transistor of sense amplifier multiplexer circuitry.

Bit lines of the nonvolatile memory array 220 have a discharge path 210 through a side of the array. The discharge transistors of the discharge path 210 are turned on by separately decoded signals YG[7:0] (from the column decoder) to separately open the different discharge paths of the different bit lines. During a program operation, the decoded signal corresponding to the particular discharge transistor opens the correct discharge path, in particular the source side bit line of the programmed memory cell. In addition, the bit lines of the nonvolatile memory array 220 have a second discharge path in the vicinity of the multiplexer circuitry 232 associated with the sense amplifier and data line driver 240.

Separately decoded drain signals YD[7:0] and separately decoded source signals YS[7:0] turn on multiplexer transistors to electrically connect the bit lines to, respectively, the drain output transistor turned on by the signal YD_D0 and the source output transistor turned on by the signal YS_S0, thereby multiplexing the multiple bit lines to the sense amplifier circuitry. Because both sides of each memory cell are read, the bit lines can be separately electrically connected to a drain side voltage or a source side voltage.

The YGB signal turns on the discharge transistor to open the second discharge path at the same time as the YG signals of the first discharge path. The discharge transistor is electrically connected to the source output transistor. Consequently, during a program operation, multiple discharge paths are open at a same time, from the source side bit line. These multiple discharge paths effectively decrease the source side resistance of the bit line R_mb1 to (¼) R_mb1. For the simplicity of calculation, generally about half of the bit line with a resistance of (½) R_mb1 is to the top of the memory cell undergoing programming, and generally about half of the bit line with a resistance of (½) R_mb1 is to the bottom of the memory cell undergoing programming. Because these two paths are on and discharging at the same time, the two parallel resistances of (½) R_mb1 have an overall source side resistance of (¼) R_mb1.

The decreased overall source side resistance widens the operation sensing window, because of the decreased voltage drop magnitude that results from the parasitic resistance which varies across the memory array. Because of the decreased effects of parasitic resistance during a program operation, the second bit effect during a read operation is greatly decreased.

Figure 3:
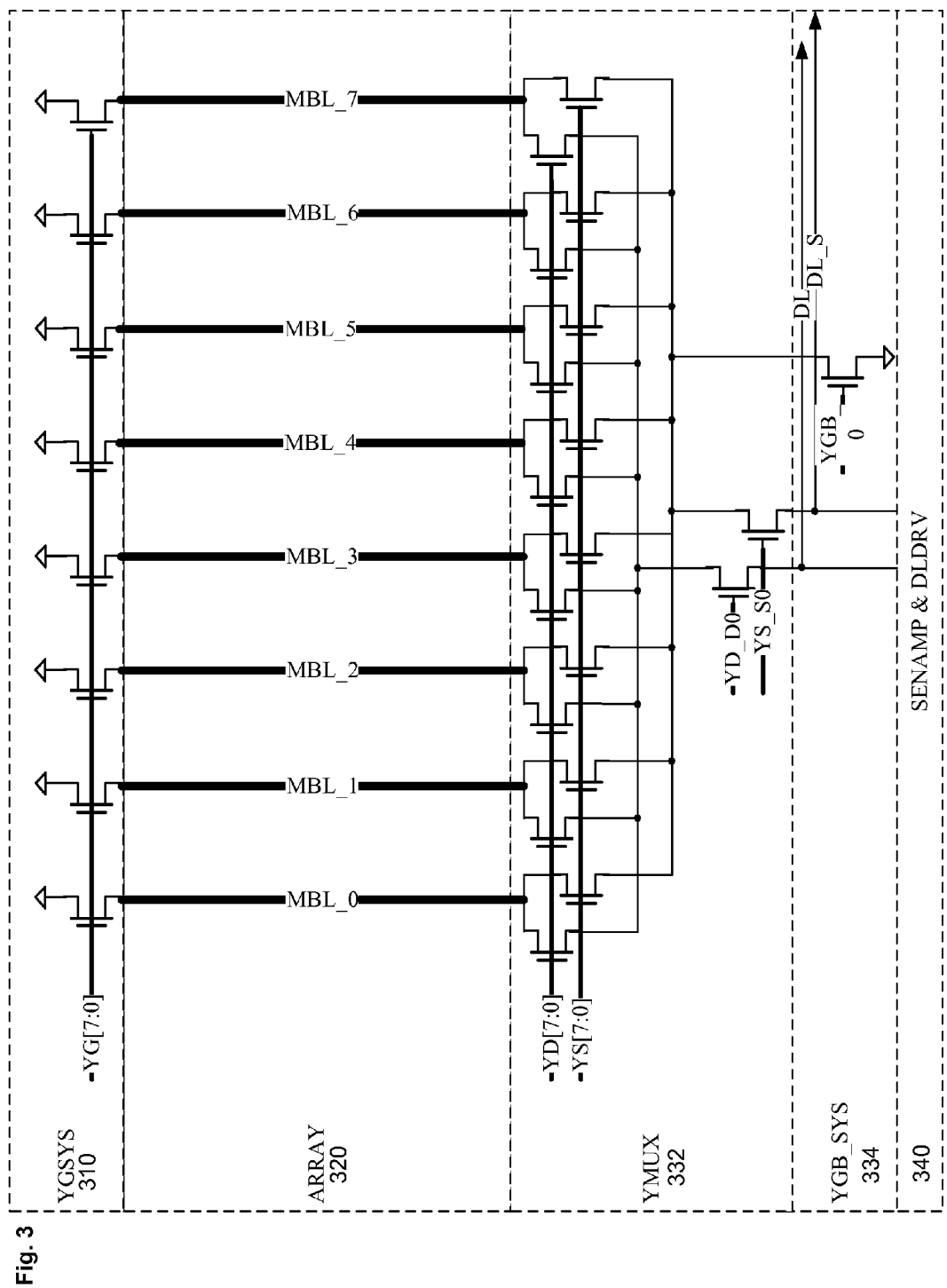
FIG. 3 is a simplified circuit diagram of an improved nonvolatile memory array with multiple discharge paths for bit lines, which electrically connects a second discharge path to the multiplexer transistors of sense amplifier multiplexer circuitry, bypassing the output transistor of sense amplifier multiplexer circuitry.

FIG. 3 is a simplified circuit diagram of an improved nonvolatile memory array with multiple discharge paths for bit lines, which electrically connects a second discharge path to the multiplexer transistors of sense amplifier multiplexer circuitry, bypassing the output transistor of sense amplifier multiplexer circuitry.

Bit lines of the nonvolatile memory array 320 have a discharge path 310 through a side of the array. The discharge transistors of the discharge path 310 are turned on by separately decoded signals YG[7:0] to separately open the different discharge paths of the different bit lines. During a program operation, the decoded signal corresponding to the particular discharge transistor opens the correct discharge path, in particular the source side bit line of the programmed memory cell. In addition, the bit lines of the nonvolatile memory array 320 have a second discharge path in the vicinity of the multiplexer circuitry 332 associated with the sense amplifier and data line driver 340.

Separately decoded drain signals YD[7:0] and separately decoded source signals YS[7:0] turn on multiplexer transistors to electrically connect the bit lines to, respectively, the drain output transistor turned on by the signal YD_D0 and the source output transistor turned on by the signal YS_S0, thereby multiplexing the multiple bit lines to the sense amplifier circuitry.

The YGB signal turns on the discharge transistor to open the second discharge path at the same time as the YG signals of the first discharge path. The discharge transistor is electrically connected to the outputs of the source multiplexer transistors of the multiplexer circuitry, bypassing the source output transistor of the multiplexer circuitry.

Figure 4:
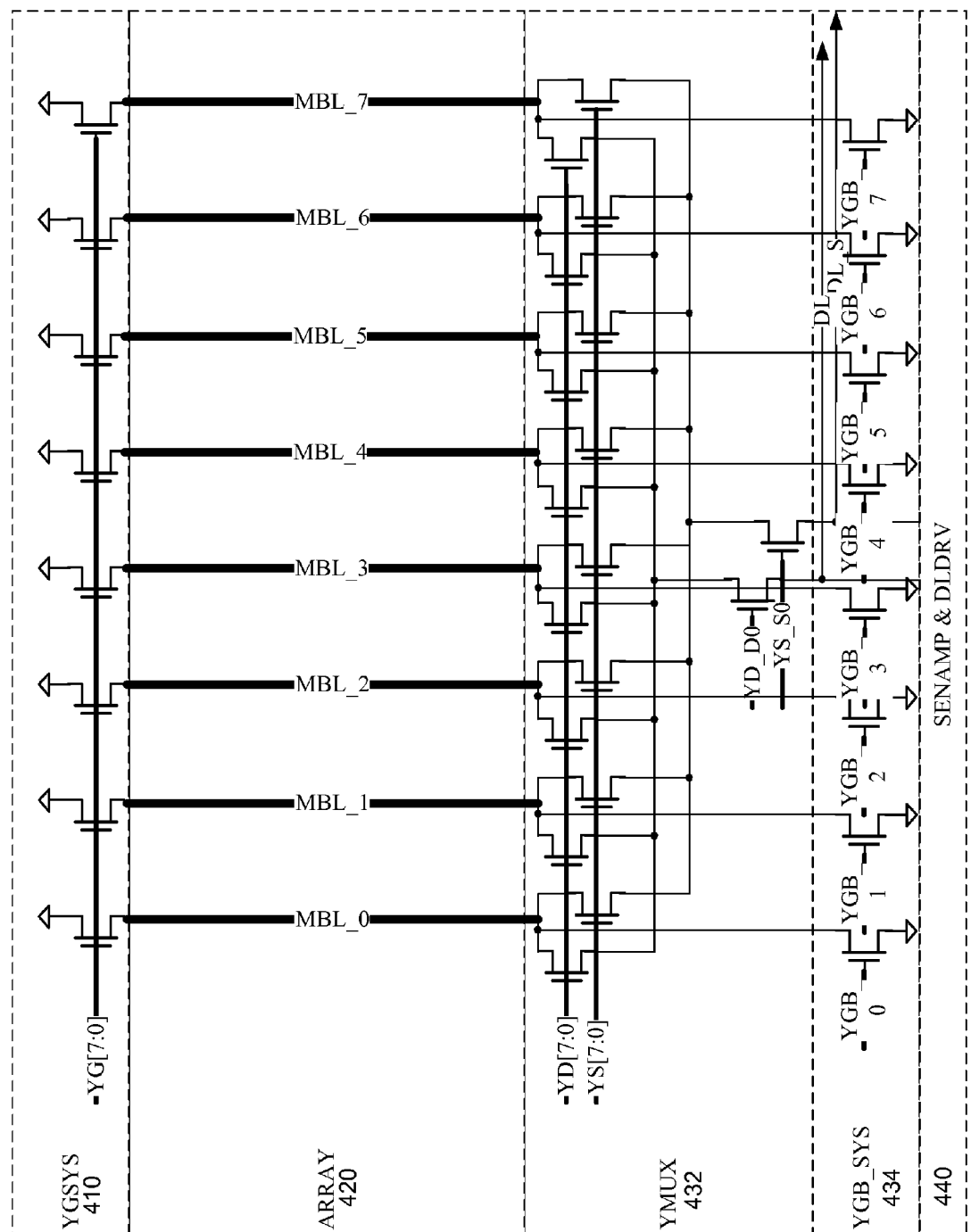
FIG. 4 is a simplified circuit diagram of an improved nonvolatile memory array with multiple discharge paths for bit lines, which electrically connects individual second discharge paths to individual main bit lines, bypassing multiplexer transistors and the output transistor of sense amplifier multiplexer circuitry

FIG. 4 is a simplified circuit diagram of an improved nonvolatile memory array with multiple discharge paths for bit lines, which electrically connects individual second discharge paths to individual main bit lines, bypassing multiplexer transistors and the output transistor of sense amplifier multiplexer circuitry This embodiment, unlike FIGS. 2 and 3 described above, does not make much additional use of the circuitry for the sense amplifier multiplexer, for the second bit line discharge path. However, for a large integrated circuit size, such area conservation does not matter much.

Bit lines of the nonvolatile memory array 420 have a discharge path 410 through a side of the array. The discharge transistors of the discharge path 410 are turned on by separately decoded signals YG[7:0] to separately open the different discharge paths of the different bit lines. During a program operation, the decoded signal corresponding to the particular discharge transistor opens the correct discharge path, in particular the source side bit line of the programmed memory cell. In addition, the bit lines of the nonvolatile memory array 420 have a second discharge path in the vicinity of the multiplexer circuitry 432 associated with the sense amplifier and data line driver 440.

Separately decoded drain signals YD[7:0] and separately decoded source signals YS[7:0] turn on multiplexer transistors to electrically connect the bit lines to, respectively, the drain output transistor turned on by the signal YD_D0 and the source output transistor turned on by the signal YS_S0, thereby multiplexing the multiple bit lines to the sense amplifier circuitry.

The discharge signals YGB[7:0] turn on the discharge transistors to open the second discharge path at the same time as the YG[7:0] signals of the first discharge path. The discharge transistor is electrically connected to the main bit lines, bypassing the source multiplexer transistors of the multiplexer circuitry, and also bypassing the source output transistor of the multiplexer circuitry.

Figure 5:
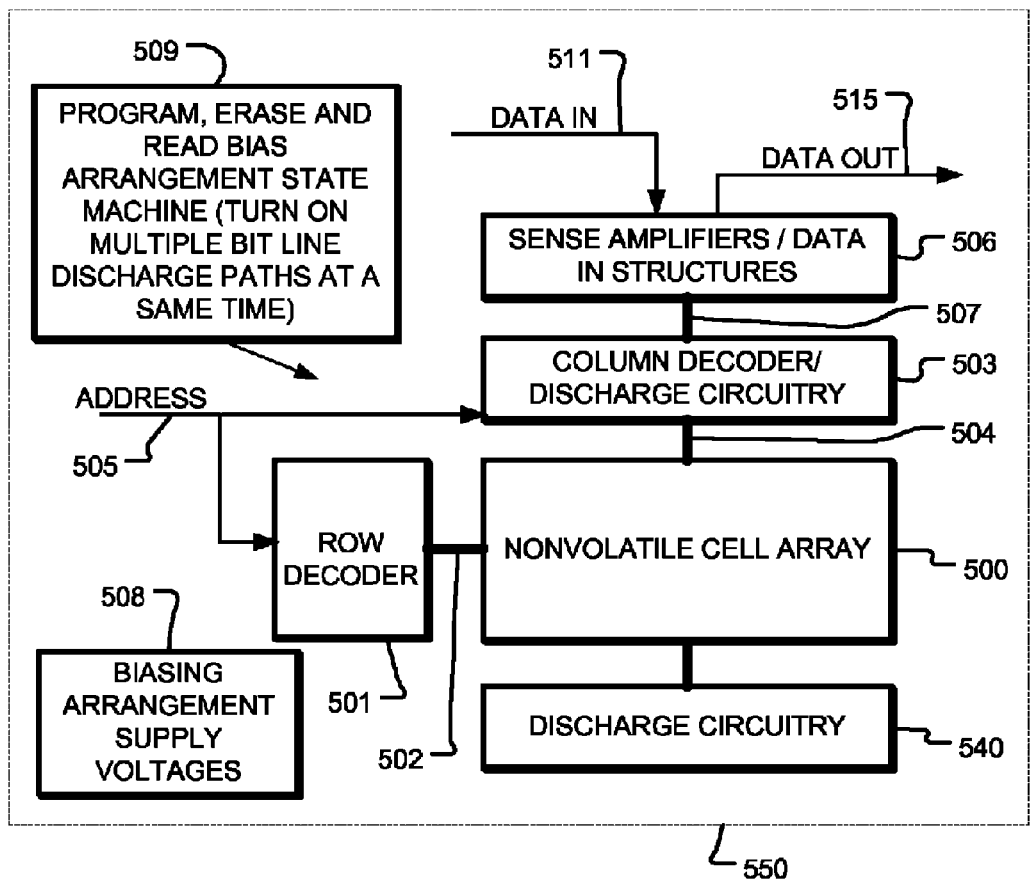
FIG. 5 is a block diagram of an example memory integrated circuit with multiple discharge paths for bit lines.

FIG. 5 is a block diagram of an example memory integrated circuit with multiple discharge paths for bit lines.

An integrated circuit 550 including a memory array 500 is implemented using improved multiple bit line path discharge circuitry as described herein. Multiple bit line discharge paths are provided during a program operation, through both discharge circuitry 540 and column decoder/discharge circuitry 503. A word line (or row) and block select decoder 501 is coupled to, and in electrical communication with, a plurality 502 of word lines, and arranged along rows in the memory array 500. A bit line (column) decoder and drivers 503 are coupled to and in electrical communication with a plurality of bit lines 504 arranged along columns in the memory array 500 for reading data from, and writing data to, the memory cells in the memory array 500. Addresses are supplied on bus 505 to the word line decoder and drivers 501 and to the bit line decoder 503. Sense amplifiers and data-in structures in block 506, including current sources for the read, program and erase modes, are coupled to the bit line decoder 503 via the bus 507. Data is supplied via the data-in line 511 from input/output ports on the integrated circuit 550, to the data-in structures in block 506. Data is supplied via the data-out line 515 from the sense amplifiers in block 506 to input/output ports on the integrated circuit 550, or to other data destinations internal or external to the integrated circuit 550.

While the present invention is disclosed by reference to the preferred embodiments and examples detailed above, it is to be understood that these examples are intended in an illustrative rather than in a limiting sense. It is contemplated that modifications and combinations will readily occur to those skilled in the art, which modifications and combinations will be within the spirit of the invention and the scope of the following claims.

What is claimed is:

1. An apparatus, comprising:
    an array of memory cells;
    a plurality of bit lines accessing the array of memory cells, at least one bit line of the plurality of bit lines each having:
        a first discharge node coupled to discharge from said at least one bit line; and
        a second discharge node coupled to discharge from said at least one bit line, the first discharge node and the second discharge nodes at different locations along said at least one bit line; and
    discharge circuitry electrically connected to the first discharge node and the second discharge node of the at least one bit line coupled to provide multiple discharge paths, wherein the discharge circuitry coupled to the first discharge node and the discharge circuitry coupled to the second discharge node are controlled by different signals.

2. The apparatus of claim 1, further comprising:
    control circuitry providing the different signals for the at least one bit line of the plurality of bit lines at a same time.

3. The apparatus of claim 1,
    wherein the discharge circuitry includes:
        a first plurality of discharge transistors electrically connected to the first discharge nodes of the plurality of bit lines, such that different bit lines of the plurality of bit lines discharge through different discharge transistors of the first plurality of discharge transistors, and
        a second plurality of discharge transistors electrically connected to the second discharge nodes of the plurality of bit lines, such that different bit lines of the plurality of bit lines discharge through different discharge transistors of the second plurality of discharge transistors.

4. The apparatus of claim 1,
    wherein the discharge path of the second node bypasses a sense amplifier multiplexer circuitry.

5. The apparatus of claim 1,
    the discharge path of the second node goes through at least part of a sense amplifier multiplexer circuitry electrically connected to the second discharge node of the plurality of bit lines.

6. The apparatus of claim 5, further comprising:
    sense amplifier multiplexer circuitry, comprising:
        a plurality of multiplexer transistors having first current carrying terminals electrically connected to the second discharge node of the plurality of bit lines, and second current carrying terminals; and
        a set of output transistors electrically connected to the second current carrying terminals of the plurality of multiplexer transistors.

7. The apparatus of claim 4, further comprising:
    sense amplifier multiplexer circuitry, comprising:
        a plurality of multiplexer transistors having first current carrying terminals electrically connected to the second discharge node of the plurality of bit lines and second current carrying terminals; and
        a set of output transistors electrically connected to the second current carrying terminals of the plurality of multiplexer transistors.

8. The apparatus of claim 7, wherein the second discharge path goes through a second plurality of discharge transistors of the bit line discharge circuitry electrically connected to the second discharge node of the plurality of bit lines, such that different bit lines of the plurality of bit lines discharge through different discharge transistors of the second plurality of discharge transistors.

9. The apparatus of claim 1, further comprising:
    sense amplifier multiplexer circuitry, comprising:
        a plurality of multiplexer transistors having first current carrying terminals electrically connected to the second discharge node of the plurality of bit lines and second current carrying terminals; and a set of output transistors electrically connected to the second current carrying terminals of the plurality of multiplexer transistors, wherein the discharge path of the second node goes through the plurality of multiplexer transistors of the sense amplifier multiplexer circuitry, but bypassing the set of output transistors of the sense amplifier multiplexer circuitry.

10. A method, comprising:

opening multiple discharge paths at a same time by turning on multiple discharge transistors, with different signals controlling discharge paths exiting each bit line of a plurality of bit lines at a first discharge node and a second discharge node of said each bit line, the first discharge node and the second discharge node at different locations along said each bit line; and electrically discharging at least one of plurality of bit lines via the multiple discharge paths at a same time, wherein the plurality of bit lines access an array of nonvolatile memory cells.

11. The method of claim 10, wherein the multiple discharge paths and the multiple discharge transistors include:

a first discharge path through a plurality of discharge transistors, such that different bit lines of the plurality of bit lines have the first discharge path through different discharge transistors of the plurality of discharge transistors, and a second discharge path through at least part of sense amplifier multiplexer circuitry.

12. The method of claim 10, wherein the multiple discharge paths and the multiple discharge transistors include:

a first discharge path through a first plurality of discharge transistors electrically connected to a first discharge node of the plurality of bit lines, such that different bit lines of the plurality of bit lines have the first discharge path through different discharge transistors of the first plurality of discharge transistors, and a second discharge path through a second plurality of discharge transistors electrically connected to a second discharge node of the plurality of bit lines, such that different bit lines of the plurality of bit lines have the second discharge path through different discharge transistors of the second plurality of discharge transistors.

13. The method of claim 10, wherein the multiple discharge paths and the multiple discharge transistors include:

a first discharge path through a first plurality of discharge transistors electrically connected to a first discharge node of the plurality of bit lines, such that different bit lines of the plurality of bit lines have the first discharge path through different discharge transistors of the first plurality of discharge transistors, and a second discharge path through a second plurality of discharge transistors electrically connected to a second discharge node of the plurality of bit lines, such that different bit lines of the plurality of bit lines have the second discharge path through different discharge transistors of the second plurality of discharge transistors, such that the second discharge path bypasses sense amplifier multiplexer circuitry.

14. The method of claim 10, wherein the multiple discharge paths and the multiple discharge transistors include:

a first discharge path through a plurality of discharge transistors electrically connected to a first discharge node of the plurality of bit lines, such that different bit lines of the plurality of bit lines have the first discharge path through different discharge transistors of the plurality of discharge transistors, and a second discharge path through at least sense amplifier multiplexer circuitry electrically connected to a second discharge node of the plurality of bit lines.

15. The method of claim 10, wherein the multiple discharge paths and the multiple discharge transistors include:

a first discharge path through a plurality of discharge transistors electrically connected to a first discharge node of the plurality of bit lines, such that different bit lines of the plurality of bit lines have the first discharge path through different discharge transistors of the plurality of discharge transistors, and a second discharge path bypassing a plurality of multiplexer transistors sense amplifier multiplexer circuitry and a set of output transistors of the sense amplifier multiplexer circuitry.

16. The method of claim 10, wherein the multiple discharge paths and the multiple discharge transistors include:

a first discharge path through a first plurality of discharge transistors electrically connected to a first discharge node of the plurality of bit lines, such that different bit lines of the plurality of bit lines have the first discharge path through different discharge transistors of the first plurality of discharge transistors, and a second discharge path bypassing a plurality of multiplexer transistors of sense amplifier multiplexer circuitry and a set of output transistors of the sense amplifier multiplexer circuitry, the second discharge path through a second plurality of discharge transistors electrically connected to a second discharge node of the plurality of bit lines, such that different bit lines of the plurality of bit lines have the second discharge path through different discharge transistors of the second plurality of discharge transistors.

17. The method of claim 10, wherein the multiple discharge paths and the multiple discharge transistors include:

a first discharge path through a plurality of discharge transistors of the bit line discharge circuitry electrically connected to the first discharge node of the plurality of bit lines, such that different bit lines of the plurality of bit lines have the first discharge path through different discharge transistors of the plurality of discharge transistors, and a second discharge path through a plurality of multiplexer transistors of sense amplifier multiplexer circuitry and a set of output transistors of the sense amplifier multiplexer circuitry.

18. The method of claim 10, wherein electrically discharging the bit line via multiple discharge paths at the same time occurs during a program operation.

19. A method for memory operation comprising:

providing an array of memory cells of the memory integrated circuit;

providing a plurality of bit lines of the memory integrated circuit having multiple discharge paths by turning on multiple discharge transistors at a same time, that discharge the plurality of bit lines, wherein each of the plurality of bit lines has at least a first discharge node and a second discharge node, wherein a first set of the multiple discharge paths of different bit lines are separately controlled by a first set of different transistors at the first discharge node of the plurality of bit lines, and a second set of the multiple discharge paths of different bit lines are separately controlled by a second set of different transistors at the second discharge node of the plurality of bit lines.

\* \* \* \* \*